United States Patent
Huang et al.

(10) Patent No.: US 10,079,392 B2
(45) Date of Patent: Sep. 18, 2018

(54) METAL-DOPED GRAPHENE AND GROWTH METHOD OF THE SAME

(71) Applicant: Industrial Technology Research Institute, Hsinchu (TW)

(72) Inventors: Kun-Ping Huang, Miaoli County (TW); Yu-Wen Chi, Taipei (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 15/202,582

(22) Filed: Jul. 6, 2016

(65) Prior Publication Data
US 2017/0263940 A1 Sep. 14, 2017

(30) Foreign Application Priority Data
Mar. 8, 2016 (TW) .............................. 105106978 A (51) Int. Cl.
| | |
|---|---|
| *H01M 4/86* | (2006.01) |
| *H01G 11/86* | (2013.01) |
| *H01M 4/90* | (2006.01) |
| *H01M 4/80* | (2006.01) |
| *H01M 4/92* | (2006.01) |
| *H01G 11/36* | (2013.01) |
| *C23C 16/511* | (2006.01) |
| *H01M 4/88* | (2006.01) |
| *C23C 16/26* | (2006.01) |

(52) U.S. Cl.
CPC ........... *H01M 4/8652* (2013.01); *C23C 16/26* (2013.01); *C23C 16/511* (2013.01); *H01G 11/36* (2013.01); *H01G 11/86* (2013.01); *H01M 4/8867* (2013.01); *H01M 4/9041* (2013.01); *H01M 4/9083* (2013.01); *H01M 4/921* (2013.01); *H01M 4/926* (2013.01); *Y02E 60/13* (2013.01)

(58) Field of Classification Search
CPC ............. H01M 4/8652; H01M 4/8867; H01M 4/9041; H01M 4/921; C23C 16/511; H01G 11/36; H01G 11/86; C01B 31/04; C01B 31/0407; C01B 31/0415; C01B 2204/00; C01B 2204/02; C01B 2204/04
See application file for complete search history.

(56) References Cited

U.S. PATENT DOCUMENTS

| | | | |
|---|---|---|---|
| 8,865,109 B2 | 10/2014 | Steiner, III et al. | |
| 9,187,824 B2 | 11/2015 | Fisher et al. | |
| | (Continued) | | |

FOREIGN PATENT DOCUMENTS

| | | |
|---|---|---|
| CN | 102191476 | 9/2011 |
| CN | 104528703 | 4/2015 |
| | (Continued) | |

OTHER PUBLICATIONS

Machine translation of CN 104998631.*
(Continued)

*Primary Examiner* — Daniel McCracken
(74) *Attorney, Agent, or Firm* — JCIPRNET (57) ABSTRACT

A metal-doped graphene and a growth method of the same are provided. The metal-doped graphene includes graphene and metal elements, wherein the metal elements accounts for 1-30 at % based on the total content of the metal-doped graphene. The growth method includes performing a PECVD by using a carbon precursor, a metal precursor, and a group VI precursor in order to grow the metal-doped graphene.

16 Claims, 7 Drawing Sheets

(56) References Cited

U.S. PATENT DOCUMENTS

| | | | | |
|---|---|---|---|---|
| 2013/0084237 A1* | 4/2013 | Vanier | ............... | C01B 31/0446 |
| | | | | 423/448 |
| 2014/0087501 A1* | 3/2014 | Chen | ................. | H01L 51/5206 |
| | | | | 438/29 |
| 2015/0037515 A1 | 2/2015 | Fisher et al. | | |
| 2015/0141666 A1 | 5/2015 | Chen et al. | | |

FOREIGN PATENT DOCUMENTS

| | | | | |
|---|---|---|---|---|
| CN | 104787740 | | 7/2015 | |
| CN | 104998631 | * | 10/2015 | ............. C07C 15/14 |
| CN | 105293483 | | 2/2016 | |
| TW | 201111278 | | 4/2011 | |
| TW | 201343548 | | 11/2013 | |
| TW | 201427898 | | 7/2014 | |

OTHER PUBLICATIONS

Definition of "dope," accessed online at http://www.dictionary.com/browse/dope?s=ts on Nov. 29, 2017.*

Dato, et al., Substrate-free microwave synthesis of graphene: experimental conditions and hydrocarbon precursors, New Journal of Physics 2010; 12: 125013—pp. 1-24.*

Wu et al., "Three-Dimensional Nitrogen and Boron Co-doped Graphene for High-Performance All-Solid-State Supercapacitors," Advanced Materials, Jul. 2012, pp. 5130-5135.

Choi et al., "Additional doping of phosphorus and/or sulfur into nitrogen-doped carbon for efficient oxygen reduction reaction in acidic media," Phys.Chem. Chem. Phys., Dec. 2012, pp. 1802-1805.

Wang et al., "Review on Recent Progress in Nitrogen-Doped Graphene: Synthesis, Characterization, and Its Potential Applications," ACS Catalysis, Mar. 2012, pp. 781-794.

Liu et al., "Chemical doping of graphene," Journal of Materials Chemistry, Mar. 2011, pp. 3253-3496.

Guo et al., "Graphene Doping: A Review," Insciences Journal, Apr. 2011, pp. 80-89.

Liang et al., "Sulfur and Nitrogen Dual-Doped Mesoporous Graphene Electrocatalyst for Oxygen Reduction with Synergistically Enhanced Performance," Angew. Chem. Int. Ed., Oct. 2012, pp. 11640.

Yang et al., "Sulfur-Doped Graphene as an Efficient Metal-free Cathode Catalyst for Oxygen Reduction," ACSNANO, Dec. 2011, pp. 205-211.

Wang et al., Interaction between Nitrogen and Sulfur in Co-Doped Graphene and Synergetic Effect in Supercapacitor, Scientific Reports, Apr. 2015, pp. 1-9.

Giovanni et al., "Noble metal (Pd, Ru, Rh, Pt, Au, Ag) doped graphene hybrids for electrocatalysis," Nanoscale, Jun. 2012, pp. 5002-5008.

* cited by examiner

METAL-DOPED GRAPHENE AND GROWTH METHOD OF THE SAME

CROSS-REFERENCE TO RELATED APPLICATION

This application claims the priority benefit of Taiwan application serial no. 105106978, filed on Mar. 8, 2016. The entirety of the above-mentioned patent application is hereby incorporated by reference herein and made a part of this specification.

TECHNICAL FIELD

The technical field relates to a metal-doped graphene and a growth method of the metal-doped graphene.

BACKGROUND

In recent years, the demand for fuel cells, super capacitors and energy storage elements increases in response to the rise of electric vehicles which get most of the attention of energy storage materials. Since the graphene material has high conductivity and high specific surface area, it is suitable as an electrode material for energy storage elements.

Adding adhesives and conductive agents in conventional process of graphene coating electrode is not environmentally friendly and time consuming and also decreases the efficiency of energy storage elements. Therefore, it is an important challenge to increase the conductivity of the materials and reduce the use of auxiliary materials.

In current technology, it is necessary to have extra heating process or use the specific substrate in the process of heteroatom-doped graphene. But it still cannot achieve the proper doped concentration.

SUMMARY

In accordance with one embodiment of the disclosure, a method of growing metal-doped graphene is provided. The method comprises the steps of: providing a carbon precursor, a metal precursor, and a group VI precursor, and forming a metal-doped graphene by using PECVD process with the carbon precursor, the metal precursor, and the group VI precursor. It is suitable for capacitors, catalysts or hydrogen storage materials.

In accordance with one embodiment of the disclosure, a metal-doped graphene is provided. The metal-doped graphene has high metal content and can be suitable for capacitors, catalysts or hydrogen storage materials.

In one embodiment of the disclosure, the carbon precursor includes hydrocarbon gas.

In one embodiment of the disclosure, the carbon precursor has the flow rate of about 1 sccm-100 sccm.

In one embodiment of the disclosure, the metal precursor includes aluminum precursor, palladium precursor or iron precursor.

In one embodiment of the disclosure, the metal precursor includes aluminum chloride, ferric chloride or palladium dichloride.

In one embodiment of the disclosure, the group VI precursor includes sulfur, oxygen or selenium.

In one embodiment of the disclosure, an amount of the metal precursor and the group VI precursor is independently between 10 mg and 1000 mg.

In one embodiment of the disclosure, the PECVD deposition process includes a microwave plasma torch (MPT) chemical vapor deposition (CVD) process or an inductively coupled plasma (ICP) chemical vapor deposition (CVD).

In one embodiment of the disclosure, a flame temperature is less than 500° C. during the MPT CVD process.

In one embodiment of the disclosure, a microwave power ranges from about 100 W to about 2000 W during the MPT CVD process.

In one embodiment of the disclosure, a deposition time ranges from about 0.5 min to about 10 min during the MPT CVD process.

In one embodiment of the disclosure, a working pressure ranges from about 0.001 torr to about 300 torr during the MPT CVD process.

In one embodiment of the disclosure, the metal-doped graphene is formed by growing graphene and doping metal at the same time.

In one embodiment of the disclosure, the step of forming the metal-doped graphene further includes providing inert gas.

In one embodiment of the disclosure, the step of forming the metal-doped graphene further includes doping nitrogen.

According to the disclosure, the metal-doped graphene includes graphene and metal elements, wherein the metal element accounts for 1-30 at % based on the total content of the metal-doped graphene.

In another embodiment of the disclosure, the metal-doped graphene further includes group VI elements.

In another embodiment of the disclosure, the group VI elements include sulfur, oxygen or selenium.

In another embodiment of the disclosure, the metal elements include aluminum, palladium or iron.

In another embodiment of the disclosure, the metal-doped graphene can be such as a three dimensional metal-doped graphene.

In another embodiment of the disclosure, the metal-doped graphene further includes nitrogen element.

According to the present disclosure, the three dimensional metal-doped graphene with high metal content is grown by the (microwave) plasma chemical vapor deposition method and using the materials of a carbon precursor, a metal precursor and the Group VI precursor. The method of the present disclosure provides growing graphene and doping heteroatom at the same time. It provides a rapid process, no extra heating needed and a flame temperature less than 500° C. The metal-doped graphene can be applied to the capacitors, the catalysts or hydrogen storage materials.

A detailed description is given in the following embodiments with reference to the accompanying drawings.

BRIEF DESCRIPTION OF THE DRAWINGS

The disclosure can be more fully understood by reading the subsequent detailed description and examples with references made to the accompanying drawings.

DETAILED DESCRIPTION OF DISCLOSED EMBODIMENTS

In the following detailed description, for purposes of explanation, numerous specific details are set forth in order to provide a thorough understanding of the disclosed embodiments. It will be apparent, however, that one or more embodiments may be practiced without these specific details.

Figure 1:
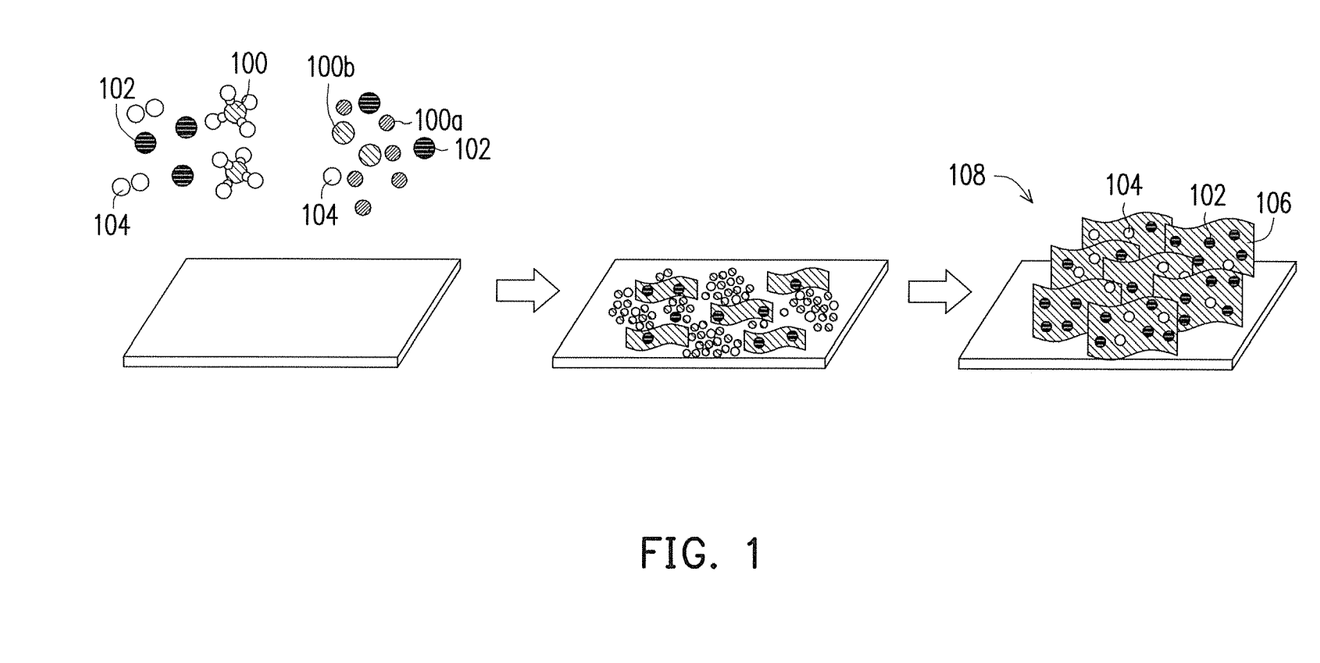
FIG. 1 shows a schematic diagram for growing a metal-doped graphene in one embodiment of the disclosure.

FIG. 1 shows a schematic diagram for growing a metal-doped graphene in one embodiment of the disclosure.

As shown in FIG. 1, in one embodiment of the disclosure, the method of growing metal-doped graphene includes providing a carbon precursor 100, a metal precursor, and a group VI precursor, and forming a metal-doped graphene by using plasma enhanced chemical vapor deposition (PECVD) process with the same. The carbon precursor includes hydrocarbon gas such as methane ($CH_4$), ethylene ($C_2H_4$), acetylene ($C_2H_2$), etc. A hydrogen atom 100a and a carbon atom 100b are formed by decomposition of the carbon precursor 100. A flow rate of the hydrocarbon gas is set to be 1 sccm to 100 sccm. The metal precursor includes aluminum precursor, palladium precursor or iron precursor. For example, the metal precursor can be aluminum chloride ($AlCl_3$), ferric chloride ($FeCl_3$) or palladium dichloride ($PdCl_2$). The abovementioned VI group precursor includes sulfur, oxygen or selenium. For example, if the aluminum chloride is as a metal precursor, sulfur can be selected as a VI group precursor. In addition, an amount of the metal precursor may be from 10 mg to 1000 mg, and an amount of the VI group precursor may be from 10 mg to 1000 mg.

In this embodiment, the plasma chemical vapor deposition process, for example, can be the microwave plasma torch (MPT) chemical vapor deposition (CVD) process or the inductively coupled plasma (ICP) chemical vapor deposition (CVD) process. For the MPT CVD process as an example, a flame temperature of microwave plasma is about less than 500° C., and a microwave power ranges from about 100 W to about 2000 W. Furthermore, during the PECVD process, a deposition time ranges from 0.5 min to 10 min, and a working pressure ranges from 0.001 torr to 300 torr, for example. The abovementioned parameters may be adjusted in accordance with demand but not limited to the above range.

Refer to the left side of the FIG. 1, it shows that the carbon atom 100b in the carbon precursor 100 and the metal atom 102 in the metal precursor are activated by the VI group atom 104 in the VI group precursor in the early stage of the PECVD process. The carbon atom 100b and the metal atom 102 are bonded together due to their reactivity as shown in the middle of the FIG. 1. After finishing the reaction, the metal-doped graphene 108 is formed by growing graphene 106 and doping metal at the same time as shown in the right side of the FIG. 1, wherein the metal element accounts for 1-30 at % based on the total content of the metal-doped graphene. The abovementioned metal-doped graphene 108, for example, can be a three dimensional metal-doped graphene. The metal-doped graphene 108 further includes the VI group element 104 such as sulfur or selenium. For example, if the VI group element is sulfur or selenium, the sulfur or selenium content accounts for 0.5 at % to 6 at % of the total content of the metal-doped graphene 108. If the VI group element is oxygen, the oxygen content accounts for 1 at % to 30 at % of the total content of the metal-doped graphene 108. On the other hand, the metal-doped graphene includes graphene 106 and metal but without the VI group element.

In another embodiment of the disclosure, the method of growing metal-doped graphene 108 further includes providing inert gas such as argon (Ar) or nitrogen ($N_2$). If the nitrogen gas is introduced during the plasma chemical vapor deposition period, the metal-doped graphene should include nitrogen element amount of 1 at % to 8 at % simultaneously.

According to the aforementioned embodiments, the metal-doped graphene 108 is formed by growing graphene and doping metal at the same time, so the doped metal atom 102 is not limited to exist on the surface of the material, but exist in the metal-doped graphene 108 with three-dimensional distribution. Therefore, the present disclosure provides high metal element content of metal-doped graphene 108 which can be used in capacitors, catalysts, hydrogen storage materials, etc.

Below, exemplary examples will be described in detail so as to be easily realized by a person having ordinary knowledge in the art. The disclosure concept may be embodied in various forms without being limited to the exemplary examples set forth herein. Descriptions of well-known parts are omitted for clarity.

Example 1

Example 1 is the growth of aluminum-doped graphene by microwave plasma torch (MPT) chemical vapor deposition (CVD) process.

A titanium substrate was disposed in the quartz reactor of the MPT CVD apparatus, and 200 mg of aluminum trichloride (as a metal precursor) and 50 mg of diphenyl disulfide (BDS, as a VI group precursor) were added to the reactor, then provided the methane (as a carbon precursor) and nitrogen gas to the quartz reactor. The methane gas and the nitrogen gas had a flow rate of 1:4. The working pressure was set below 0.05 torr, the power of microwave generator was set to 800 W to excite a plasma to process for 15 minutes. The aluminum-doped graphene was obtained.

Figure 2:
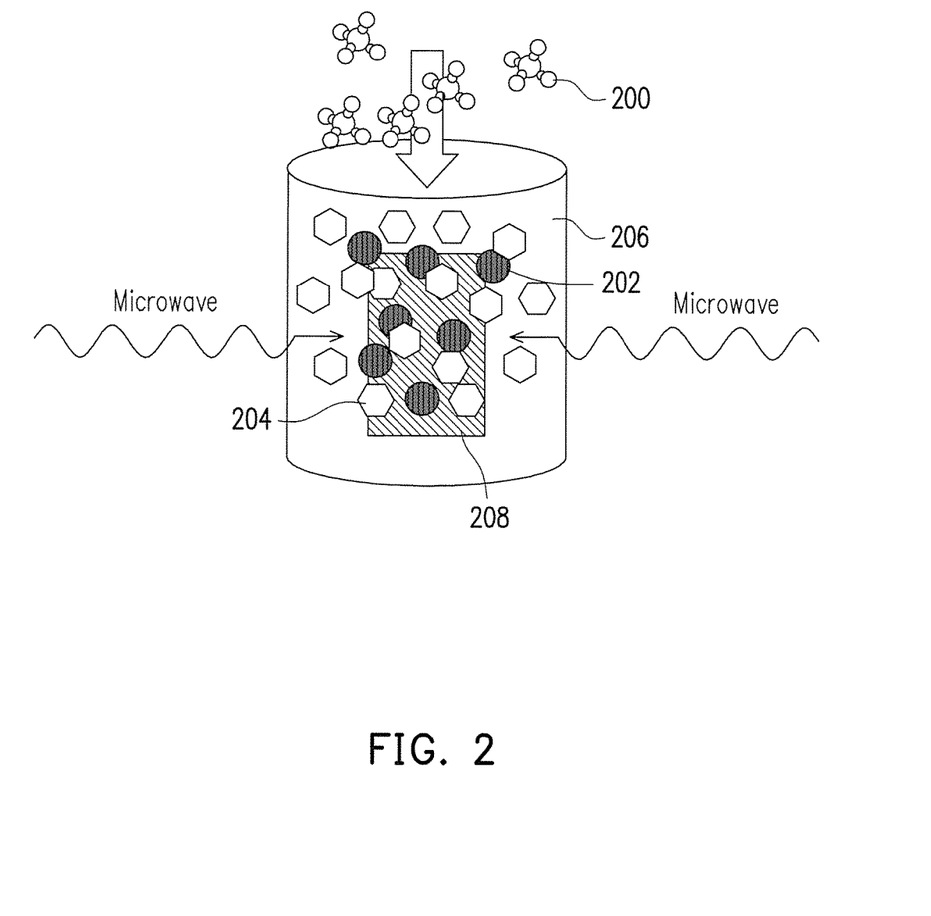
FIG. 2 shows a schematic diagram for growing a metal-doped graphene in example 1 of the present disclosure.

As shown in FIG. 2, the plasma dissociation rate was increased after microwave focusing, the reactivity of the carbon precursor ($CH_4$) 200 and the metal atom 202 in the metal precursor 202 were increased by the VI group atom 204 in VI group element, so as to cause the metal atom 202 and the carbon atom bonding together to grow graphene and dope metal at the same time. Accordingly, the metal-doped graphene was formed.

Figure 3:
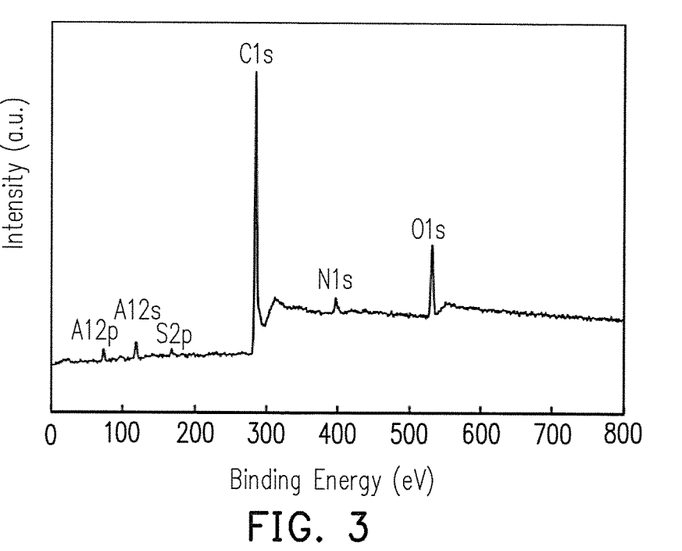
FIG. 3 shows an XPS analysis for aluminum doped graphene, according to the example 1 of the present disclosure.
Figure 4:
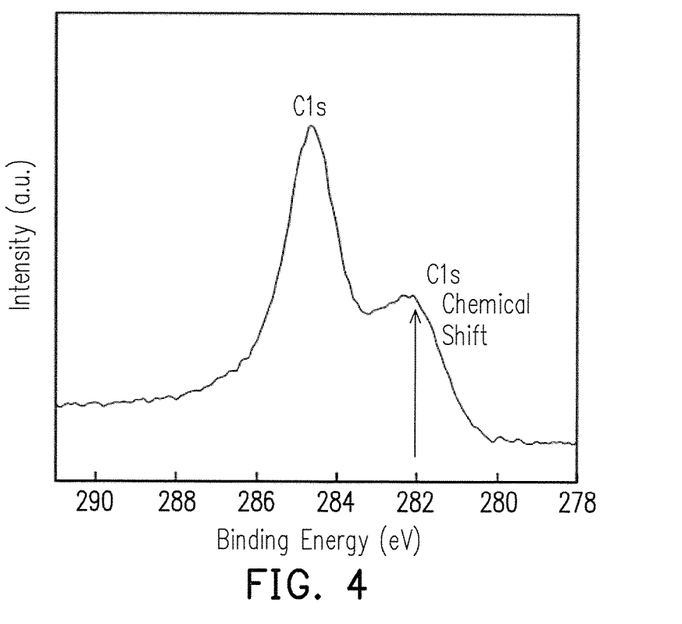
FIG. 4 shows an XPS analysis for carbon in aluminum doped graphene, according to the example 1 of the present disclosure.
Figure 5:
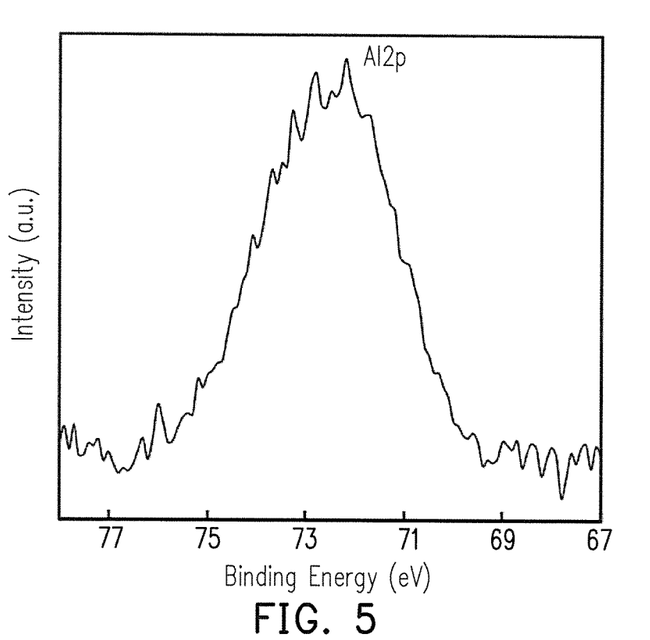
FIG. 5 shows an XPS analysis for aluminum in aluminum doped graphene, according to the example 1 of the present disclosure.

As shown in FIG. 3, the XPS analysis of the above aluminum-doped graphene has found out the following:

aluminum element has a doping ratio of 8 at %, sulfur element has a doping ratio of 2 at %, and nitrogen element has a doping ratio of 5.4 at %. FIG. 4 shows an XPS analysis for carbon in aluminum-doped graphene. FIG. 5 shows an XPS analysis for aluminum in aluminum-doped graphene.

Example 2

The difference between Example 1 and Example 2 was the parameters of the process and the amount of precursors. In this example, the aluminum trichloride had 300 mg, diphenyl disulfide had 100 mg, and the methane gas and the argon gas had a flow rate of 1:3. The working pressure was set to 0.02 torr, the power of microwave generator was set to 1000 W to excite a plasma to process for 10 minutes. The aluminum-doped graphene was formed.

Figure 6:
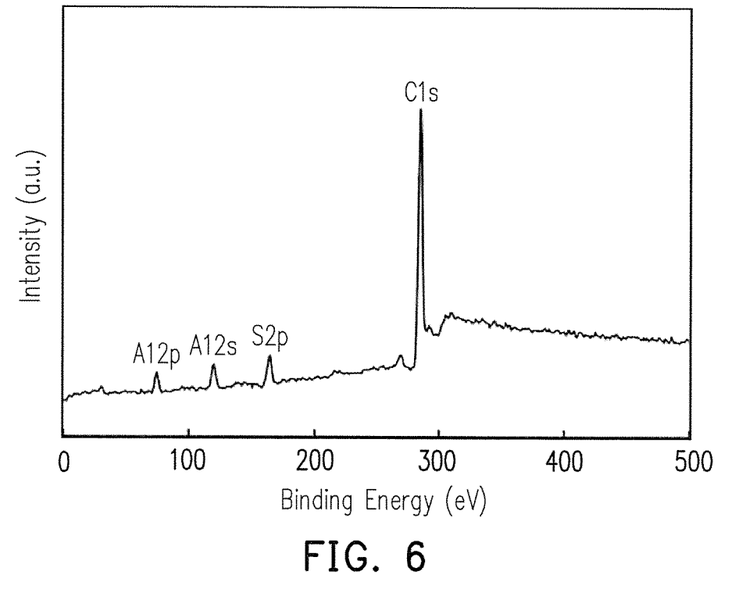
FIG. 6 shows an XPS analysis for aluminum doped graphene, according to the example 2 of the present disclosure.
Figure 7:
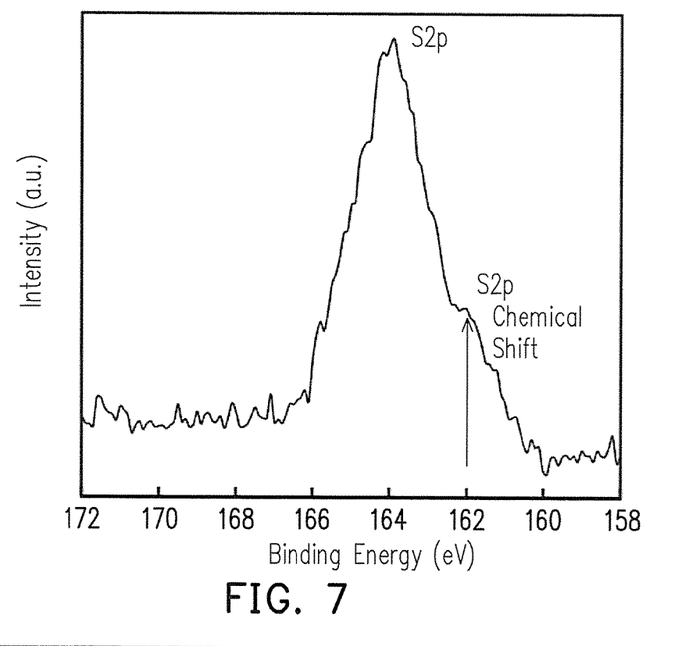
FIG. 7 shows an XPS analysis for sulfur in aluminum doped graphene, according to the example 2 of the present disclosure.

As shown in FIG. 6, the XPS analysis of the above aluminum-doped graphene has found out the following: aluminum element had a doping ratio of 10.8 at % and sulfur element had a doping ratio of 5.6 at %. FIG. 7 shows an XPS analysis for sulfur in aluminum-doped graphene.

Example 3

The difference between Example 1 and Example 3 was the parameters of the process and the amount of precursors. In this example, the aluminum trichloride had 500 mg, diphenyl disulfide had 150 mg, and the methane gas and the nitrogen gas had a flow rate of 1:4. The working pressure was set to 0.02 torr, the power of microwave generator was set to 1200 W to excite a plasma to process for 10 minutes. The aluminum-doped graphene was obtained.

Figure 8:
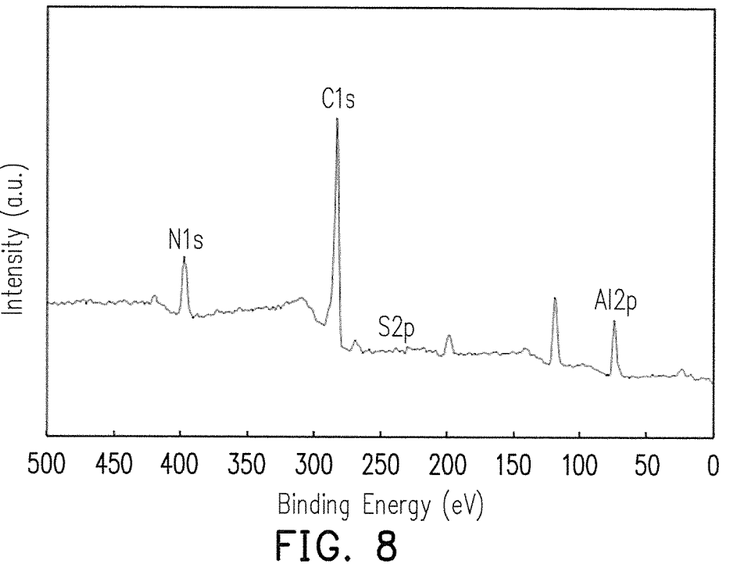
FIG. 8 shows an XPS analysis for aluminum doped graphene, according to the example 3 of the present disclosure.

As shown in FIG. 8, the XPS analysis of the above aluminum-doped graphene has found out the following: aluminum element had a doping ratio of 20 at %, sulfur element had a doping ratio of 0.5 at %, and nitrogen element had a doping ratio of 7.9 at %.

Example 4

Example 4 is the growth of palladium-doped graphene by MPT CVD process.

A titanium substrate was disposed in the quartz reactor of the MPT CVD apparatus, and 100 mg of palladium dichloride (as a metal precursor) and 50 mg of diphenyl disulfide (BDS, as a VI group precursor) were added to the reactor, then provided the methane (as a carbon precursor) and argon gas to the quartz reactor. The methane gas and the nitrogen gas had a flow rate of 1:4. The working pressure was set below 0.05 torr, the power of microwave generator was set to 1000 W to excite a plasma to process for 10 minutes. The palladium-doped graphene was obtained.

As shown in FIG. 2, the plasma dissociation rate was increased after microwave focusing, the reactivity of the carbon precursor ($CH_4$) 200 and the metal atom 202 in the metal precursor 202 were increased by the VI group atom 204 in VI group element, so as to cause the metal atom 202 and the carbon atom bonding together to grow graphene and dope metal at the same time. Accordingly, the metal-doped grapheme was formed.

Figure 9:
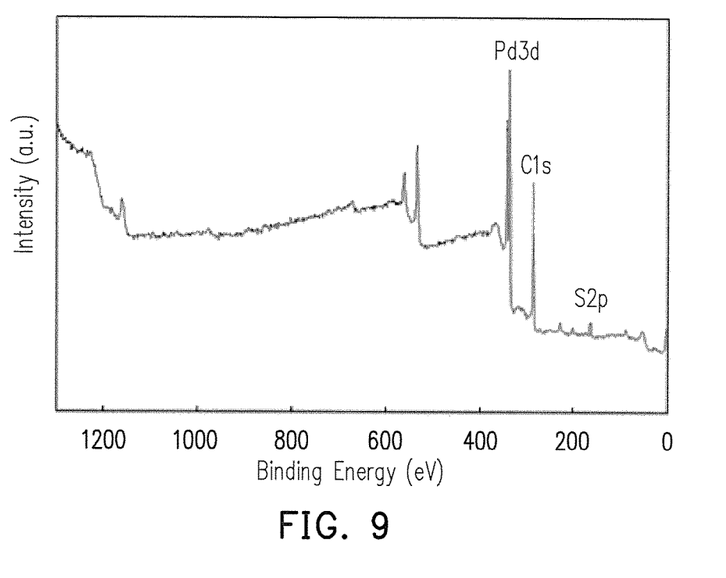
FIG. 9 shows an XPS analysis for palladium doped graphene, according to the example 4 of the present disclosure.

As shown in FIG. 9, the XPS analysis of the above palladium-doped graphene had found out the following: palladium element had a doping ratio of 12.4 at % and sulfur element has a doping ratio of 7.6 at %.

Example 5

Using the same process as example 4 to grow the palladium-doped graphene but without the VI group precursor diphenyl disulfide (BDS), and provided the methane and argon gas with the flow ratio of 1:4. The working pressure was set to 0.05 torr, the power of microwave generator was set to 1000 W to excite a plasma to process for 10 minutes. The palladium-doped graphene was obtained.

Figure 10:
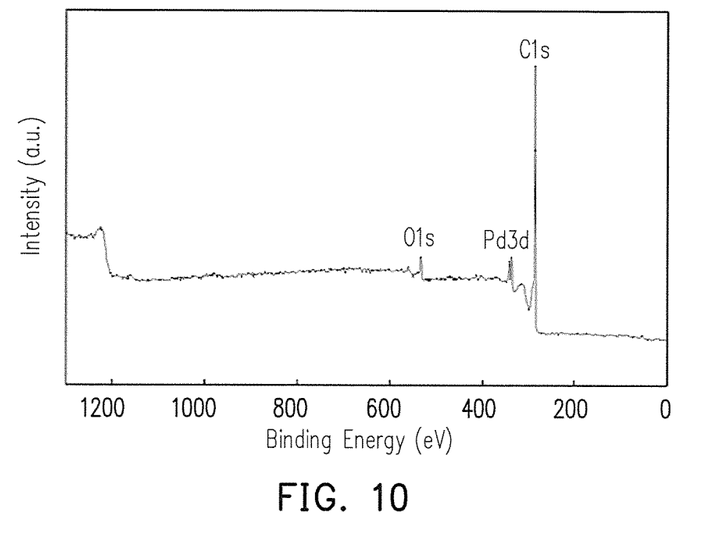
FIG. 10 shows an XPS analysis for palladium doped graphene, according to the example 5 of the present disclosure.

As shown in FIG. 10, the XPS analysis of the above palladium-doped graphene has found out the following: palladium element had a doping ratio of 1 at % and oxygen element had a doping ratio of 3 at %.

Application Example 1

The application example 1 is the test of applying aluminum-doped graphene in example 1 to be catalysts. The detailed steps and parameters are as follows.

The application example is according to the electrochemical workstations CHI 730 to evaluate the ability of oxygen reduction reaction (ORR).

For the sake of measurement of the rotating ring-disk electrode (RRDE), 1.32 mg of aluminum-doped graphene was dispersed in the mixture of 8 μL, 5 wt % of Nafion and 392 μL of alcohol in an ultrasonic tank for 20 minutes. The suspension was obtained as a testing ink.

Afterwards, 15 μL, of the homogeneous suspension (the aforementioned testing ink) was dropped onto the surface of the glassy carbon plate electrode which was dried in the vacuum at room temperature for 8 hours. Each sample had a mass load of about 0.2 mg $cm^{-2}$.

The voltage of a platinum ring electrode was polarized at 1.2V (vs. RHE) for oxidizing the intermediate from the aforementioned the plate electrode.

The measurement was proceeded by the rotating ring-disk electrode (RRDE) voltammetry in a saturated oxygen electrolyte and changing the spinning speed from 400 rpm to 1600 rpm.

For the oxygen reduction reaction (ORR), 0.1M potassium hydroxide (KOH) as a electrolyte, Ag/AgCl (Argenthal, 207 mV vs. SHE at 25° C.) as a reference, and 4 $cm^2$ of platinum wire as a counter electrode.

The potential range for RRDE was 5 mV from 0.9V to 0.2V (vs. RHE). For the cyclic voltammetry, the measurement was proceeded after purifying electrolytes with oxygen ($O_2$) or nitrogen ($N_2$) for 30 minutes, and the potential range was 10 mV $s^{-1}$ from 0.9V to 0.2V (vs. RHE) as shown in FIG. 11.

Figure 11:
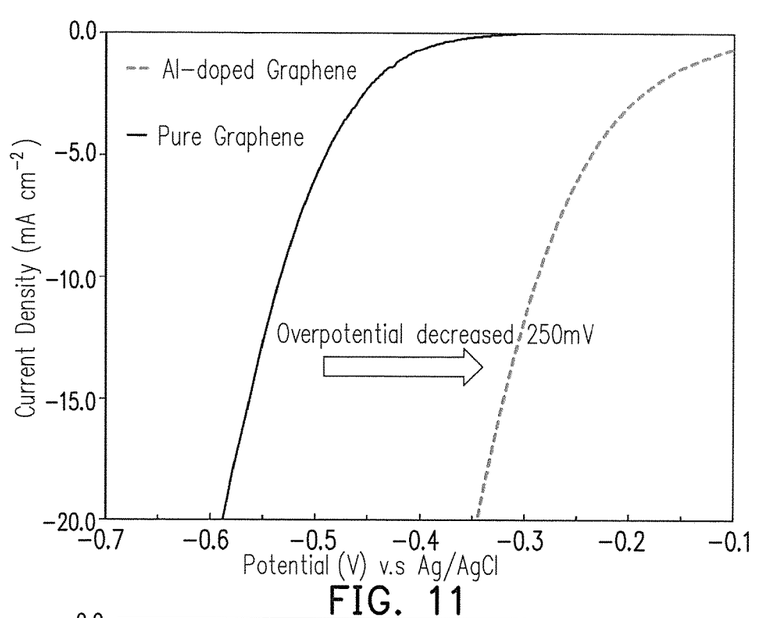
FIG. 11 shows the measured C-V curves of the application example 1.

As shown in FIG. 11, the redox catalytic overpotential of aluminum-doped graphene was 250 mV lower than that of the pure graphene.

Application Example 2

The application example 2 is the test of applying the palladium-doped graphene in example 4 and 5 to catalysts. The detailed steps and parameters were the same as the application example 1, and the testing results were as shown in FIG. 12.

Figure 12:
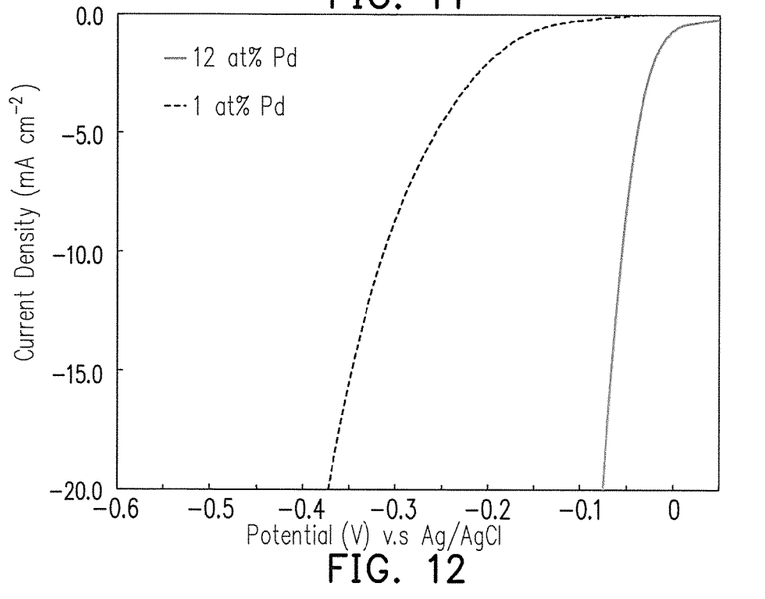
FIG. 12 shows the measured C-V curves of the application example 2.

As shown in FIG. 12, the redox catalytic overpotential of 12 at % palladium-doped graphene was 300 mV lower than that of 1 at % palladium-doped graphene, but both 12 at % and 1 at % of palladium-doped graphene were better than that of pure graphene (FIG. 11 for reference).

According to the aforementioned examples, the disclosure provides a method such as PECVD to form a high metal content of metal-doped graphene with carbon precursor, metal precursor and the VI group precursor. The method provides doping heteroatom and growing three-dimensional graphene at the same time, and provides a faster process without additional heat. The metal-doped graphene can be suitable for capacitors, catalysts or hydrogen storage materials. For example, the metal-doped graphene is used as a hydrogen storage material, the hydrogen storage capacity can be improved. The metal-doped graphene is used as a catalyst, the oxygen reduction catalytic ability will be improved. The metal-doped graphene is used as a capacitor material, it will increase the Faraday response and improve the quasi capacitance capacitors content.

It will be clear that various modifications and variations can be made to the disclosed methods and materials. It is intended that the specification and examples be considered as exemplary only, with the true scope of the disclosure being indicated by the following claims and their equivalents.

What is claimed is:

1. A method of growing metal-doped graphene, comprising the steps of:
    providing a carbon precursor, a metal precursor, and a group VI precursor;
    adding the carbon precursor, the metal precursor, and the group VI precursor into a reactor of a microwave plasma torch (MPT) chemical vapor deposition apparatus; and
    performing a microwave plasma torch (MPT) chemical vapor deposition process on the carbon precursor, the metal precursor, and the group VI precursor in order to form a metal-doped graphene, wherein the metal precursor comprises aluminum chloride, ferric chloride or palladium dichloride.

2. The method of growing metal-doped graphene as claimed in claim 1, wherein the carbon precursor comprises hydrocarbon gas.

3. The method of growing metal-doped graphene as claimed in claim 1, wherein the carbon precursor is provided at a flow rate of 1 sccm-100 sccm.

4. The method of growing metal-doped graphene as claimed in claim 1, wherein the group VI precursor comprises sulfur, oxygen or selenium.

5. The method of growing metal-doped graphene as claimed in claim 1, wherein an amount of the metal precursor and the group VI precursor is independently between 10 mg and 1000 mg.

6. The method of growing metal-doped graphene as claimed in claim 1, wherein a flame temperature is less than 500° C. during the microwave plasma torch (MPT) chemical vapor deposition process.

7. The method of growing metal-doped graphene as claimed in claim 1, wherein a microwave power ranges from 100 W to 2000 W during the micro plasma torch (MPT) chemical vapor deposition process.

8. The method of growing metal-doped graphene as claimed in claim 1, wherein a deposition time ranges from 0.5 min to 10 min during the micro plasma torch (MPT) chemical vapor deposition process.

9. The method of growing metal-doped graphene as claimed in claim 1, wherein a working pressure ranges from 0.001 torr to 300 torr during the micro plasma torch (MPT) chemical vapor deposition process.

10. The method of growing metal-doped graphene as claimed in claim 1, wherein the step of forming the metal-doped graphene comprises growing graphene and doping metal at the same time.

11. The method of growing metal-doped graphene as claimed in claim 1, wherein the step of forming the metal-doped graphene further comprises providing inert gas.

12. The method of growing metal-doped graphene as claimed in claim 1, wherein the step of forming the metal-doped graphene further comprises doping nitrogen.

13. A method of growing metal-doped graphene, comprising the steps of:
    providing a carbon precursor, a metal precursor, and a group VI precursor;
    adding the carbon precursor, the metal precursor, and the group VI precursor into a reactor of a microwave plasma torch (MPT) chemical vapor deposition apparatus; and
    performing a microwave plasma torch (MPT) chemical vapor deposition process on the carbon precursor, the metal precursor, and the group VI precursor n order to form a metal-doped graphene, wherein the metal precursor comprises aluminum precursor, palladium precursor or iron precursor, and a flame temperature is less than 500° C. during the microwave plasma torch (MPT) chemical vapor deposition process.

14. A method of growing metal-doped graphene, comprising the steps of:
    providing a carbon precursor, a metal precursor, and a group VI precursor;
    adding the carbon precursor, the metal precursor, and the group VI precursor into a reactor of a microwave plasma torch (MPT) chemical vapor deposition apparatus; and
    performing a microwave plasma torch (MPT) chemical vapor deposition process on the carbon precursor, the metal precursor, and the group VI precursor in order to form a metal-doped graphene, wherein the metal precursor comprises aluminum precursor, palladium precursor or iron precursor, and a microwave power ranges from 100 W to 2000 W during the micro plasma torch (MPT) chemical vapor deposition process.

15. A method of growing metal-doped graphene, comprising the steps of:
    providing a carbon precursor, a metal precursor, and a group VI precursor;
    adding the carbon precursor, the metal precursor, and the group VI precursor into a reactor of a microwave plasma torch (MPT) chemical vapor deposition apparatus; and
    performing a microwave plasma torch (MPT) chemical vapor deposition process on the carbon precursor, the metal precursor, and the group VI precursor in order to form a metal-doped graphene, wherein the metal precursor comprises aluminum precursor, palladium precursor or iron precursor, and a deposition time ranges from 0.5 min to 10 min during the micro plasma torch (MPT) chemical vapor deposition process.

16. A method of growing metal-doped graphene, comprising the steps of:
    providing a carbon precursor, a metal precursor, and a group VI precursor;
    adding the carbon precursor, the metal precursor, and the group VI precursor into a reactor of a microwave plasma torch (MPT) chemical vapor deposition apparatus; and
    performing a microwave plasma torch (MPT) chemical vapor deposition process on the carbon precursor, the metal precursor, and the group VI precursor in order to form a metal-doped graphene, wherein the metal precursor comprises aluminum precursor, palladium precursor or iron precursor, and a working pressure ranges from 0.001 torr to 300 torr during the micro plasma torch (MPT) chemical vapor deposition process.

\* \* \* \* \*